US010833094B2

(12) United States Patent
Piazza et al.

(10) Patent No.: US 10,833,094 B2
(45) Date of Patent: Nov. 10, 2020

(54) INTEGRATED CIRCUIT AND METHOD OF MANUFACTURING THE SAME

(71) Applicant: STMicroelectronics (Crolles 2) SAS, Crolles (FR)

(72) Inventors: Fausto Piazza, Grenoble (FR); Sebastien Lagrasta, La Terrasse (FR); Raul Andres Bianchi, Myans (FR); Simon Jeannot, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/954,874

(22) Filed: Apr. 17, 2018

(65) Prior Publication Data

US 2018/0233511 A1 Aug. 16, 2018

Related U.S. Application Data

(62) Division of application No. 15/133,394, filed on Apr. 20, 2016, now Pat. No. 9,978,764.

(30) Foreign Application Priority Data

Dec. 29, 2015 (FR) ..................................... 15 63435

(51) Int. Cl.

| | |
|---|---|
| ***H01L 27/11546*** | (2017.01) |
| ***H01L 21/28*** | (2006.01) |
| ***H01L 27/06*** | (2006.01) |

(Continued)

(52) U.S. Cl.

CPC .... *H01L 27/11546* (2013.01); *H01L 21/0217* (2013.01); *H01L 21/02164* (2013.01);

(Continued)

(58) Field of Classification Search

None

See application file for complete search history.

(56) References Cited

U.S. PATENT DOCUMENTS 7,872,298 B2 * 1/2011 Shimamoto ....... H01L 21/28282 257/320
9,041,145 B2 * 5/2015 Kawashima ........ H01L 29/4234 257/506

(Continued)

OTHER PUBLICATIONS

INPI Search Report and Written Opinion for FR 1563435 dated Sep. 12, 2016 (9 pages).

*Primary Examiner* — Abul Kalam
(74) *Attorney, Agent, or Firm* — Crowe & Dunlevy

(57) ABSTRACT

An integrated circuit includes a high-voltage MOS (HV) transistor and a capacitor supported by a semiconductor substrate. A gate stack of the HV transistor includes a first insulating layer over the semiconductor layer and a gate electrode formed from a first polysilicon. The capacitor includes a first electrode made of the first polysilicon and a second electrode made of a second polysilicon and at least partly resting over the first electrode. A first polysilicon layer deposited over the semiconductor substrate is patterned to form the first polysilicon of the gate electrode and first electrode, respectively. A second polysilicon layer deposited over the semiconductor substrate is patterned to form the second polysilicon of the second electrode. Silicon oxide spacers laterally border the second electrode and the gate stack of the HV transistor. Silicon nitride spacers border the silicon oxide spacers.

10 Claims, 7 Drawing Sheets

Fig 2D

(51) Int. Cl.

| | |
|---|---|
| ***H01L 49/02*** | (2006.01) |
| ***H01L 21/02*** | (2006.01) |
| ***H01L 21/3205*** | (2006.01) |
| ***H01L 21/3213*** | (2006.01) |
| ***H01L 27/11521*** | (2017.01) |
| ***H01L 29/49*** | (2006.01) |
| ***H01L 29/66*** | (2006.01) |
| *H01L 21/8234* | (2006.01) |
| *H01L 27/11541* | (2017.01) |

(52) U.S. Cl.

CPC .. *H01L 21/28035* (2013.01); *H01L 21/32055* (2013.01); *H01L 21/32133* (2013.01); *H01L 27/0629* (2013.01); *H01L 27/11521* (2013.01); *H01L 28/00* (2013.01); *H01L 28/60* (2013.01); *H01L 29/40114* (2019.08); *H01L 29/4916* (2013.01); *H01L 29/6656* (2013.01); *H01L 29/66825* (2013.01); *H01L 21/823468* (2013.01); *H01L 27/11541* (2013.01)

(56) References Cited

U.S. PATENT DOCUMENTS

| | | | |
|---|---|---|---|
| 2006/0030112 | A1 | 2/2006 | Han et al. |
| 2006/0134874 | A1 | 6/2006 | Kamiya |
| 2008/0029805 | A1* | 2/2008 | Shimamoto ....... H01L 21/28282 257/315 |
| 2009/0273883 | A1 | 11/2009 | Schwantes et al. |
| 2010/0032741 | A1 | 2/2010 | Ueno |
| 2010/0155852 | A1 | 6/2010 | Piazza et al. |
| 2011/0062507 | A1 | 3/2011 | Wu et al. |
| 2011/0095348 | A1 | 4/2011 | Chakihara et al. |
| 2011/0260228 | A1* | 10/2011 | Kawashima ........ H01L 29/4234 257/298 |
| 2011/0269291 | A1 | 11/2011 | Ueno |
| 2012/0034751 | A1 | 2/2012 | Ariyoshi et al. |
| 2013/0193437 | A1 | 8/2013 | Lisart et al. |
| 2014/0024183 | A1 | 1/2014 | Hsu et al. |

* cited by examiner

NVM
HV
CAPA
LV

NVM
HV
CAPA
LV

INTEGRATED CIRCUIT AND METHOD OF MANUFACTURING THE SAME

PRIORITY CLAIM

This application is a divisional of U.S. application for patent Ser. No. 15/133,394, filed Apr. 20, 2016, which claims the priority benefit of French Patent application number 1563435, filed on Dec. 29, 2015, the disclosures of which are hereby incorporated by reference in their entireties to the maximum extent allowable by law.

TECHNICAL FIELD

The present disclosure relates to an integrated circuit and a method of manufacturing the same, the integrated circuit comprising MOS transistors of different types and at least one capacitor.

BACKGROUND

In an integrated circuit, MOS transistors of different types are currently used including, for example, MOS transistors intended to operate at high voltages, or HV transistors, MOS transistors intended to operate at lower voltages, or LV transistors, and floating-gate MOS transistors, or NVM transistors, forming non-volatile memories. The gate stack of an NVM transistor comprises, on a gate insulator, a gate electrode, called “floating gate”, topped with another gate electrode, called “control gate”, electrically insulated from the floating gate. Generally, such an integrated circuit generally comprises at least one capacitor CAPA for generating high voltages capable of being applied to the control gate, to the drain, or to the source of the NVM transistors.

In the case of an integrated circuit comprising MOS transistors of different types, the number and/or the thickness of the spacers bordering the gate stack of each type of transistor should be selected according to the voltages likely to be applied to this type of transistor.

It would thus be desirable to have a method of manufacturing an integrated circuit comprising MOS transistors of different types associated with different spacers. It would also be desirable for this manufacturing method to enable to form a capacitor capable of delivering high voltages.

SUMMARY

Thus, an embodiment provides a method of manufacturing an integrated circuit comprising at least one high-voltage MOS transistor, HV, and at least one capacitor, CAPA, the method comprising the successive steps of: a) forming, on a semiconductor layer, a first insulating layer at the location of the HV transistor; b) depositing a first polysilicon layer; c) forming a gate stack of the HV transistor and a first electrode of capacitor CAPA by etching the first polysilicon layer; d) successively forming a first silicon oxide layer, a silicon nitride layer, and a second silicon oxide layer; e) depositing a second polysilicon layer; f) forming a second electrode of capacitor CAPA at least partly resting on the first electrode by etching the second polysilicon layer, and removing the exposed portions of the second oxide layer; g) forming first silicon oxide spacers laterally bordering the gate stack of the HV transistor and the first and second electrodes; and h) forming second silicon nitride spacers laterally bordering the gate stack of the HV transistor and the first and second electrodes.

According to an embodiment, the integrated circuit further comprises at least one floating gate MOS transistor, NVM, the method further comprising, at the location of the NVM transistor, the steps of: a1) at step a), forming a second insulating layer on the semiconductor layer; c1) at step c), leaving in place the first polysilicon layer; f1) at step f), leaving in place the second polysilicon layer; i) after step h), forming a gate stack of the NVM transistor by etching the second polysilicon layer, the second oxide layer, the silicon nitride layer, the first oxide layer, and the first polysilicon layer; and j) over the entire integrated circuit, forming third spacers laterally bordering the gate stacks of the HV and NVM transistors and the first and second electrodes.

According to an embodiment, the integrated circuit further comprises at least one low-voltage MOS transistor, LV, the method further comprising, at the location of the LV transistor, the steps of: c2) at step c), removing the first polysilicon layer; d2) at step d), removing the second oxide layer, the nitride layer, and the first oxide layer; e2) at step e), forming, on the semiconductor layer and prior to the forming of the second polysilicon layer, a third insulating layer; f2) at step f), leaving in place the second polysilicon layer; k) after step j), forming a gate stack of the LV transistor by etching the second polysilicon layer; and l) over the entire integrated circuit, forming fourth spacers laterally bordering the gate stacks of the HV, NVM, and LV transistors and the first and second electrodes of capacitor CAPA.

According to an embodiment, an integrated circuit comprises at least one high-voltage MOS transistor, HV, and at least one capacitor, CAPA, wherein: the gate stack of the HV transistor comprises a first insulating layer resting on a semiconductor layer and coated with a first polysilicon; capacitor CAPA comprises a first electrode made of the first polysilicon resting on the semiconductor layer, and a second electrode made of a second polysilicon at least partly resting on the first electrode, a first silicon oxide layer coated with a silicon nitride layer, itself coated with a second silicon oxide layer separating the second electrode from the semiconductor layer and from the first electrode; first silicon oxide spacers laterally border the second electrode and the gate stack of the HV transistor; and second silicon nitride spacers border the first spacers, the first oxide layer and the nitride layer also extending between the first spacers and the gate stack of the HV transistor, and under the first and second spacers.

According to an embodiment, the integrated circuit further comprises at least one floating-gate MOS transistor, NVM, wherein: the gate stack of the NVM transistor comprises a second insulating layer resting on the semiconductor layer and successively coated with the first polysilicon, with the second oxide layer, with the nitride layer, with the first oxide layer, and with the second polysilicon; and third spacers laterally border the gate stack of the NVM transistor and the second spacers.

According to an embodiment, the integrated circuit further comprises at least one low-voltage MOS transistor, LV, wherein: the gate stack of the LV transistor comprises a third insulating layer resting on the semiconductor layer and coated with the second polysilicon; and fourth spacers laterally border the gate stack of the LV transistor and the third spacers.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1A:
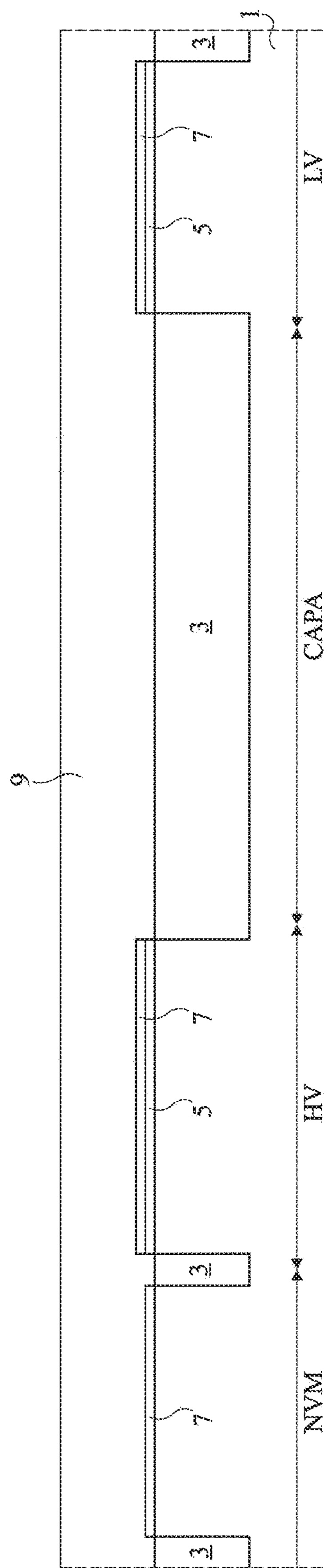
FIGS. 1A to 1G illustrate a structure at successive steps of an example of an integrated circuit manufacturing method.

The same elements have been designated with the same reference numerals in the various drawings and, further, the various drawings are not to scale. For clarity, only those elements which are useful to the understanding of the described embodiments have been shown and are detailed. In the following description, terms "over" and "under" refer to the orientation of the concerned elements in the corresponding drawings.

FIGS. 1A to 1G are simplified cross-section views showing a structure at successive steps of an example of a method of manufacturing an integrated circuit comprising various types of transistors and a capacitor.

In FIG. 1A, the structure comprises a semiconductor layer 1, for example, a silicon layer, only a portion thereof being shown. The shown portion comprises a location for a floating-gate MOS transistor, NVM, a location for a high-voltage MOS transistor, HV, a location for a capacitor, CAPA, and a location for a low-voltage MOS transistor, LV. Insulating structures 3, for example, trenches filled with an insulating material, have been formed in semiconductor layer 1 and delimit the locations of the NVM, HV, and LV transistors, and of capacitor CAPA. In this example, one of insulating structures 3 extends under the entire surface of the location of capacitor CAPA. A first gate insulator layer 5 has been formed on semiconductor layer 1 at the location of the HV MOS transistor, and a second gate insulator layer 7 has been formed on semiconductor layer 1 at the location of the NVM transistor. More particularly, in this example, first insulating layer 5 has been formed over the entire exposed surface of semiconductor layer 1 and then removed from the location of the NVM transistor, and second insulating layer 7 has then been formed on semiconductor layer 1 at the location of the NVM transistor, and on layer 5 at the location of the HV and LV transistors. A polysilicon layer 9 has then been deposited over the entire structure.

As an example, layer 5 is a silicon oxide layer capable of having a thickness in the range from 5 to 15 nm, for example, 9 nm. Layer 7 is for example a silicon oxide layer capable of having a thickness in the range from 5 to 10 nm, for example, 9 nm. The thickness of polysilicon layer 9 may be in the range from 100 to 150 nm, for example, 125 nm. Polysilicon 9 may be doped at an implantation step subsequent to its deposition, or in situ as it is being deposited.

Figure 1B:
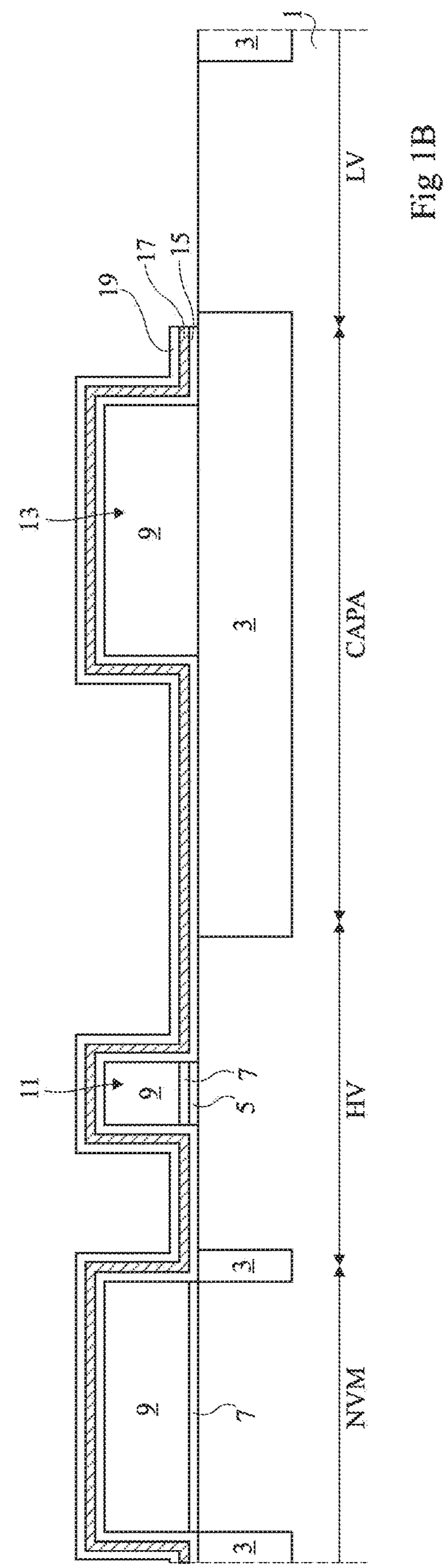

FIG. 1B shows the structure of FIG. 1A after gate stack 11 of the HV transistor and of first electrode 13 of capacitor CAPA have been delimited. To achieve this, at the location of the HV transistor, polysilicon layer 9 and gate insulator layers 7 and 5 are removed by etching while portions of these layers corresponding to gate stack 11 are left in place and, at the location of capacitor CAPA, polysilicon layer 9 is removed by etching while a portion of this layer corresponding to electrode 13 is left in place. Layers 9, 7, and 5 are also removed by etching at the location of the LV transistor, and left in place at the location of the NVM transistor. This etch step is carried out simultaneously at the locations of capacitor CAPA and of the HV and LV transistors. The etch step is followed by the successive forming, over the entire structure, of a silicon oxide layer 15, of a conformal silicon nitride layer 17, and of a conformal silicon oxide layer 19. Layers 15, 17, and 19 are then removed by etching at the location of the LV transistor.

As an example, the thickness of oxide layer 15 is in the range from 3 to 20 nm, for example, 4 nm. The thickness of nitride layer 17 may be in the range from 2 to 5 nm, for example, 3.5 nm. The thickness of oxide layer 19 may be in the range from 2 to 10 nm, for example, 4 nm.

Figure 1C:
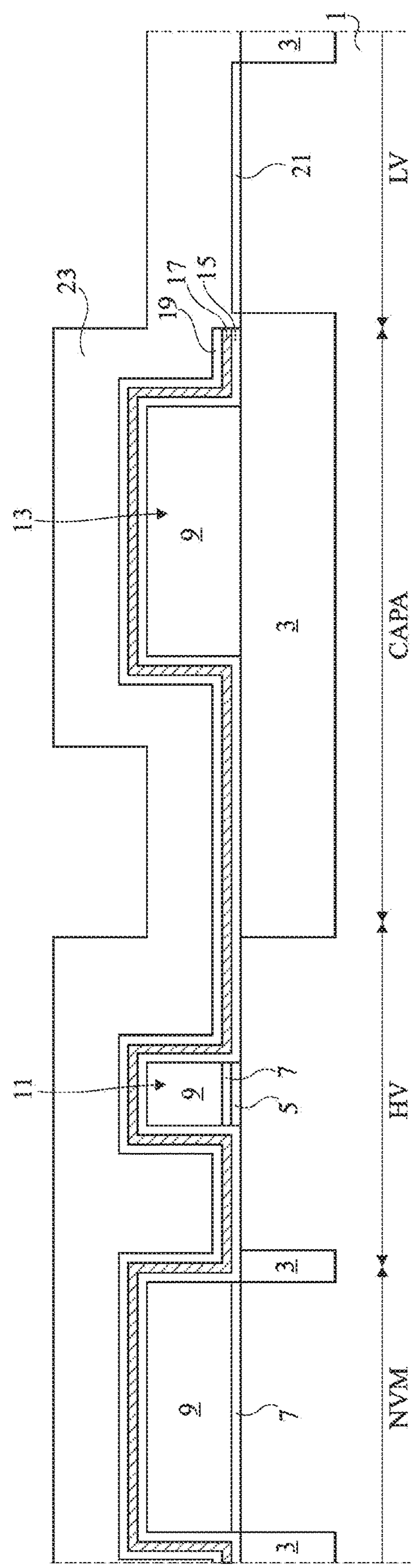

FIG. 1C shows the structure of FIG. 1B after the forming of a gate insulator layer 21 at the location of the LV transistor, followed by the deposited of a polysilicon layer 23 over the entire structure.

As an example, layer 21 is a silicon oxide layer. The thickness of layer 21 may be in the range from 1 to 10 nm, for example, 2.5 nm. The thickness of polysilicon layer 23 may be in the range from 60 to 120 nm, for example, 100 nm. Polysilicon 23 may be doped at an implantation step subsequent to its deposition, or in situ as it is being deposited.

Figure 1D:
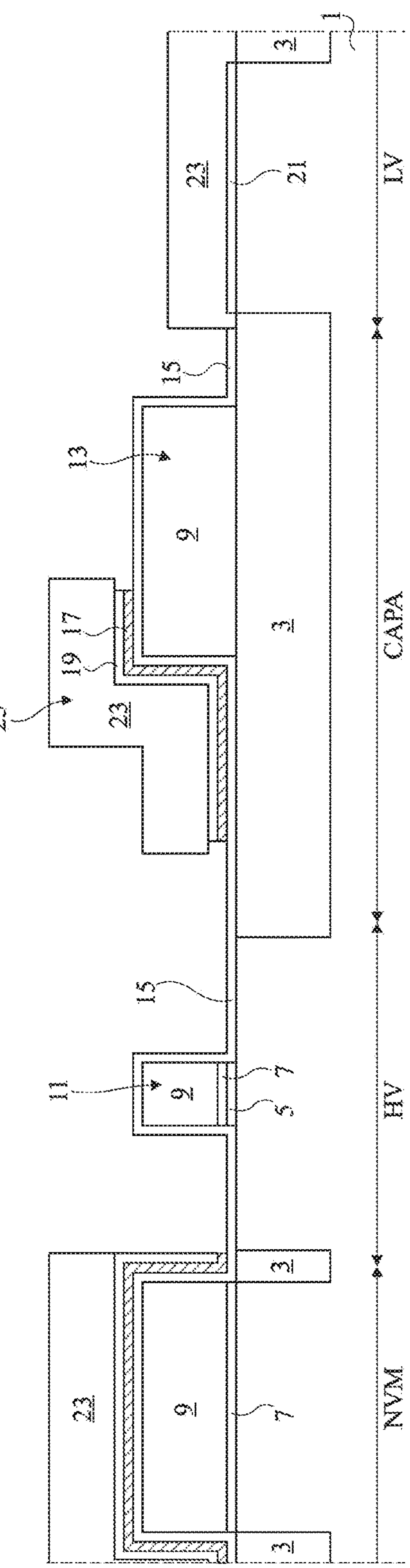

FIG. 1D shows the structure of FIG. 1C after delimitation of second electrode 25 of capacitor CAPA, electrode 25 at least partly resting on electrode 13. To achieve this, at the locations of capacitor CAPA and of the HV transistor, polysilicon layer 23 is removed by etching while a portion of layer 23 corresponding to electrode 25 is left in place, layer 23 being left in place at the location of the NVM and LV transistors. The etching is stopped on silicon nitride layer 17, whereby the portions of silicon oxide layer 19 exposed after the etching of polysilicon 23 are also removed. The portions of nitride layer 17 exposed after the etching of oxide layer 19 are then removed by isotropic etching, for example, by wet etching.

As shown herein, the isotropic etching of nitride layer 17 partially extends under polysilicon 23, on the sides of electrode 25, where nitride layer 17 risks being overetched. Further, on etching of silicon oxide 19 and possibly on etching of silicon nitride layer 17, silicon oxide layer 19 also risks being overetched under the sides of electrode 15.

Figures 1E, 1F:
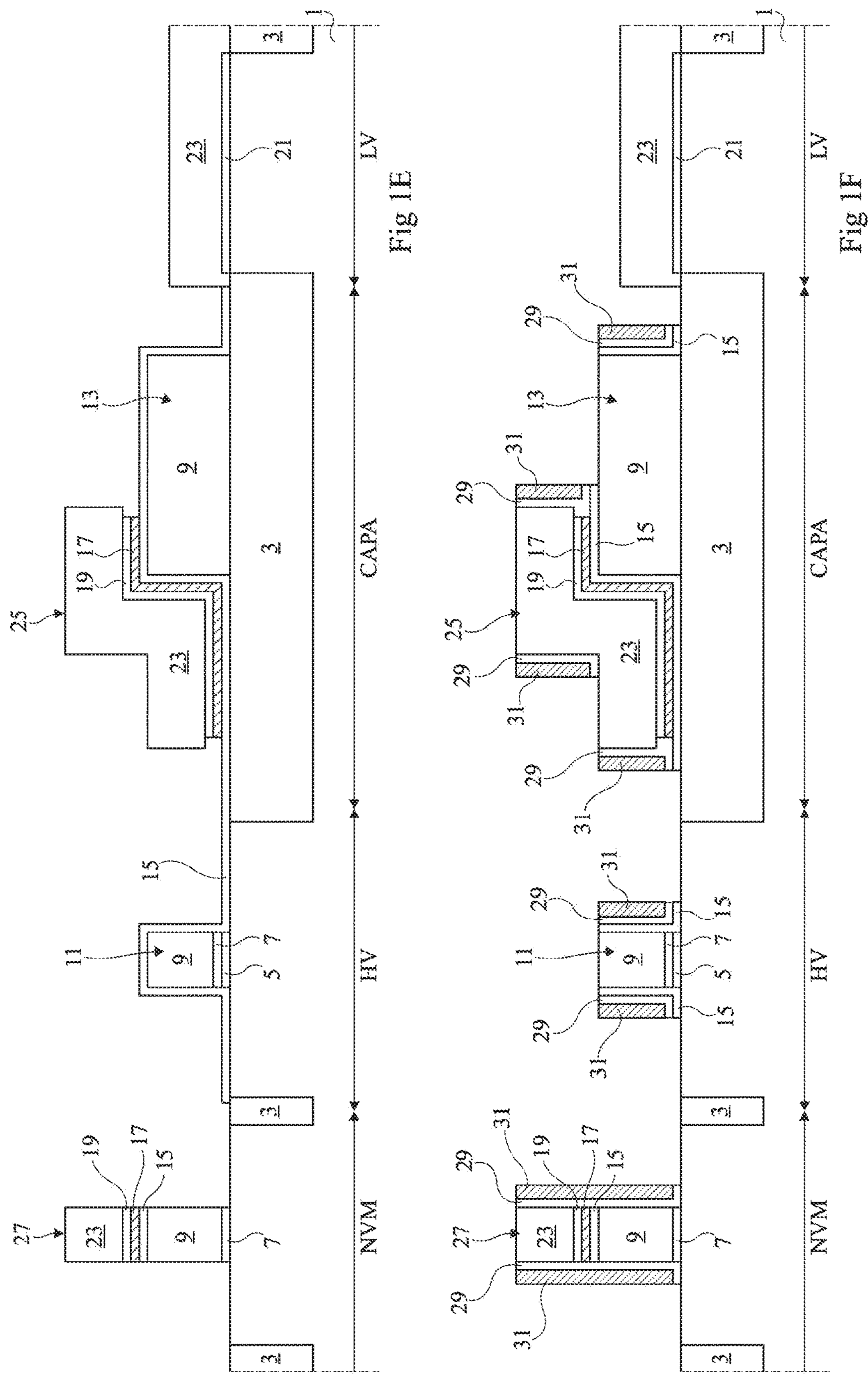

FIG. 1E shows the structure of FIG. 1D after the forming of gate stack 27 of the NVM transistor. To achieve this, at the location of the NVM transistor, layers 23, 19, 17, 15, 9, and 7 are removed by etching while portions of these layers corresponding to gate stack 27 are left in place. During this etch step, layers 23 and 15 are left in place at the locations of capacitor CAPA and of the HV and LV transistors.

FIG. 1F shows the structure of FIG. 1E after the forming of silicon oxide spacers 29 and of silicon nitride spacers 31. To achieve this, a silicon oxide layer 29 is formed by thermal oxidation at least at the locations of capacitor CAPA and of the HV and NVM transistors, after which a silicon nitride layer 31 is conformally deposited on oxide layer 29. Silicon oxide 29 and silicon nitride 31 are then etched by anisotropic etching to form silicon oxide spacers 29 laterally bordering gate stacks 11 and 27 of the HV and NVM transistors, and electrodes 13 and 25 of capacitor CAPA, and to form silicon nitride spacers 31 laterally bordering spacers 29.

Figure 1G:
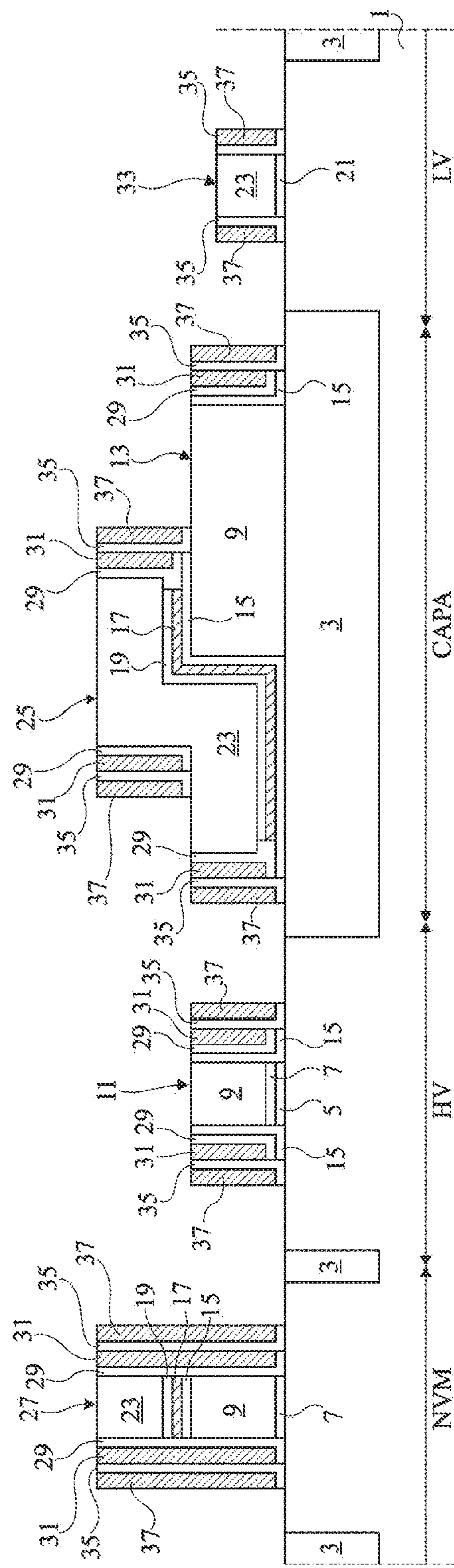

FIG. 1G shows the structure of FIG. 1F after delimitation of gate stack 33 of the LV transistor, followed by the forming of silicon oxide spacers 35 and of silicon nitride spacers 37. To achieve this, at the location of the LV transistor, polysilicon layer 23 and gate insulator layer 21 are removed by etching while portions of these layers corresponding to gate stack 33 are left in place. On forming of gate stack 33, the layers or layer portions already formed at the locations of capacitor CAPA and of the NVM and HV transistors are left in place. After delimitation of gate stack 33, a silicon oxide layer 35 followed by a silicon nitride 37 are conformally formed over the entire structure. Silicon oxide 35 and silicon nitride 37 are then etched by anisotropic etching to form spacers made of silicon oxide 35 and of silicon nitride 37 on the vertical walls of the structure. In particular, silicon oxide spacers 35 laterally border gate stacks 11, 27, and 33 of the HV, NVM, and LV transistors, and electrodes 13 and 25 of capacitor CAPA, and are themselves bordered by silicon nitride spacers 37.

An integrated circuit comprising a capacitor CAPA and NVM, HV, and LV transistors is thus obtained.

A disadvantage of the above-described manufacturing method is that, in the obtained integrated circuit, gate stacks 27 and 11 of the NVM and HV transistors are bordered with the same spacers 29, 31, 35, and 37, while it would be desirable for gate stacks 27 of the NVM transistors to be bordered with a set of spacers thinner than that bordering gate stacks 11 of the HV transistors. Thick spacers are necessary on HV transistors to ensure their breakdown voltage. However, NVM transistors do not need spacers as thick as for HV transistors. Such thick spacers increase the bulk of NVM transistors and decrease the density of the non-volatile memory areas of the integrated circuit.

Another disadvantage of this method is that it provides a thermal oxidation step to replace with thermal oxide 29 insulating layer portions 17 and possibly 19, which are overetched under the sides of electrode 25 during the step described in relation with FIG. 1D. Such a thermal oxidation provides a satisfactory insulation between the two electrodes 13 and 25 of capacitor CAPA, which would not be the case if such overetched portions were replaced with conformally-deposited silicon oxide, for example, by CVD ("Chemical Vapor Deposition"), the insulating properties thereof being poorer than those of thermal silicon oxide.

It would thus be desirable to have a method of manufacturing an integrated circuit which overcomes at least some of the disadvantages of the method described in relation with FIGS. 1A to 1G.

FIGS. 2A to 2F are simplified cross-section views showing a structure at successive steps of an embodiment of a manufacturing method.

Figure 2A:
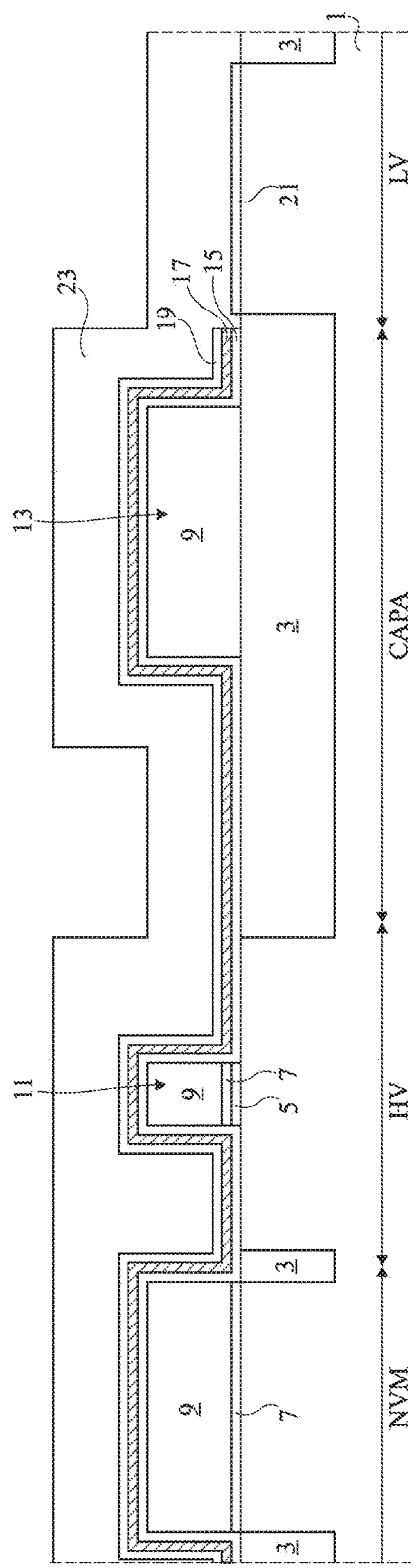
FIGS. 2A to 2E illustrate a structure at successive steps of an embodiment of an integrated circuit manufacturing method.

FIG. 2A is identical to FIG. 1C and shows the structure obtained after having carried out the steps described in relation with FIGS. 1A to 1C.

Figure 2B:
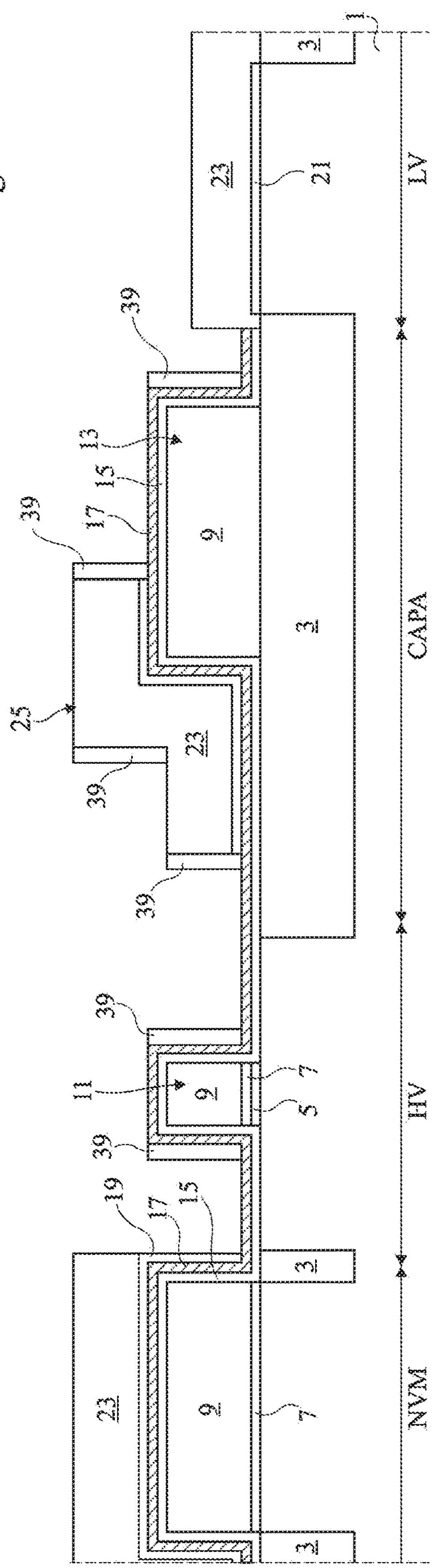

FIG. 2B shows the structure of FIG. 2A after delimitation of second electrode 25 of capacitor CAPA, followed by the forming of silicon oxide spacers 39. To achieve this, as described in relation with FIG. 1D, at the location of capacitor CAPA, polysilicon layer 23 is removed by etching while leaving in place a portion of layer 23 corresponding to electrode 25, the latter at least partly resting on electrode 13. During this etching, layer 23 is also removed at the location of the HV transistor. The etching of polysilicon layer 23 carries on with the etching of silicon oxide layer 19, which is stopped on nitride layer 17. A silicon oxide layer 39 is then conformally deposited, at least at the locations of capacitor CAPA and of the HV transistor. Silicon oxide 39 is etched by anisotropic etching to form silicon oxide spacers 39 laterally bordering electrodes 13 and 25 of capacitor CAPA and gate stack 11 of the HV transistor. As an example, the thickness of spacers 39 is in the range from 2 to 25 nm, for example, 15 nm.

Figures 2C, 2D:
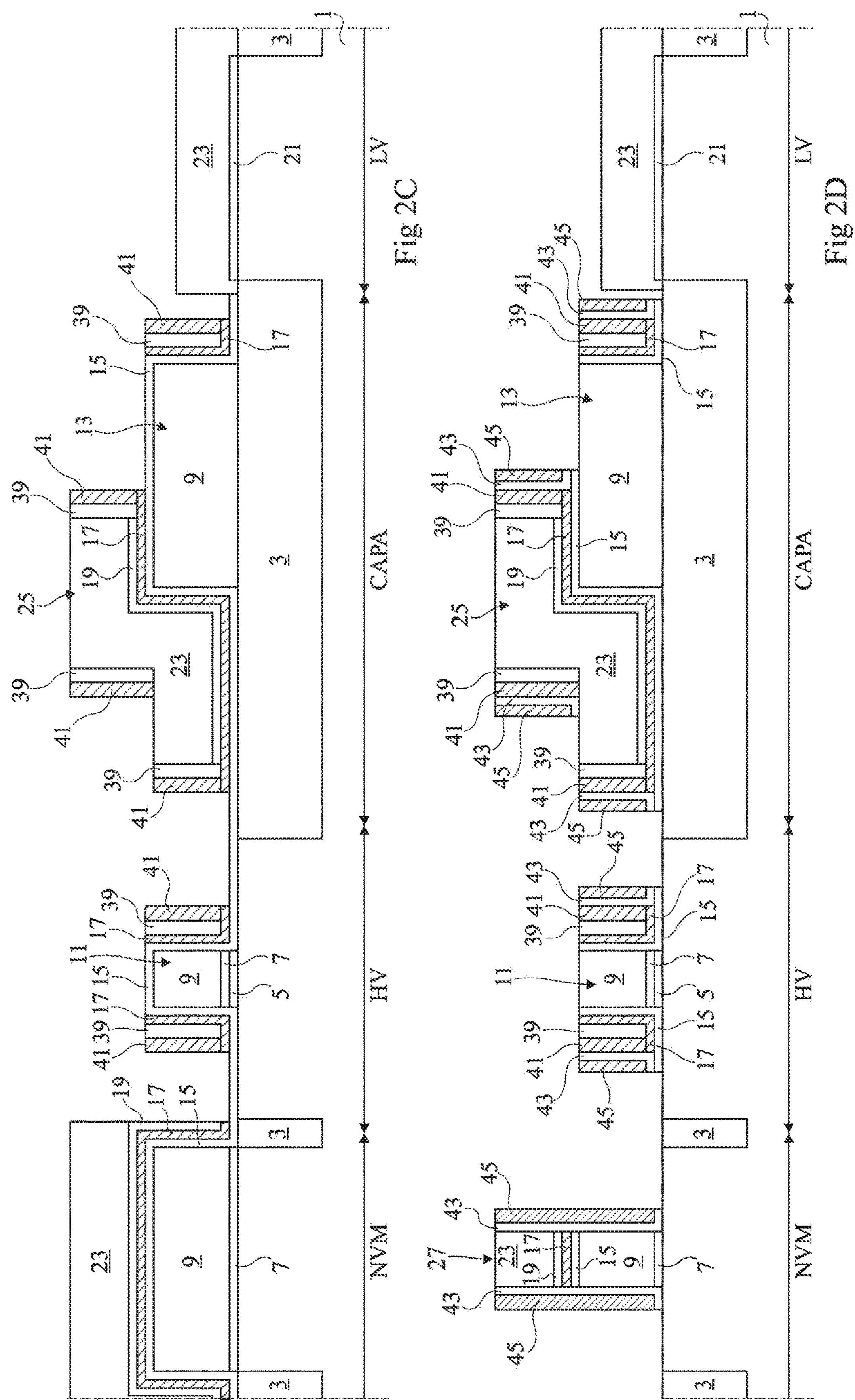
Figure 2E:
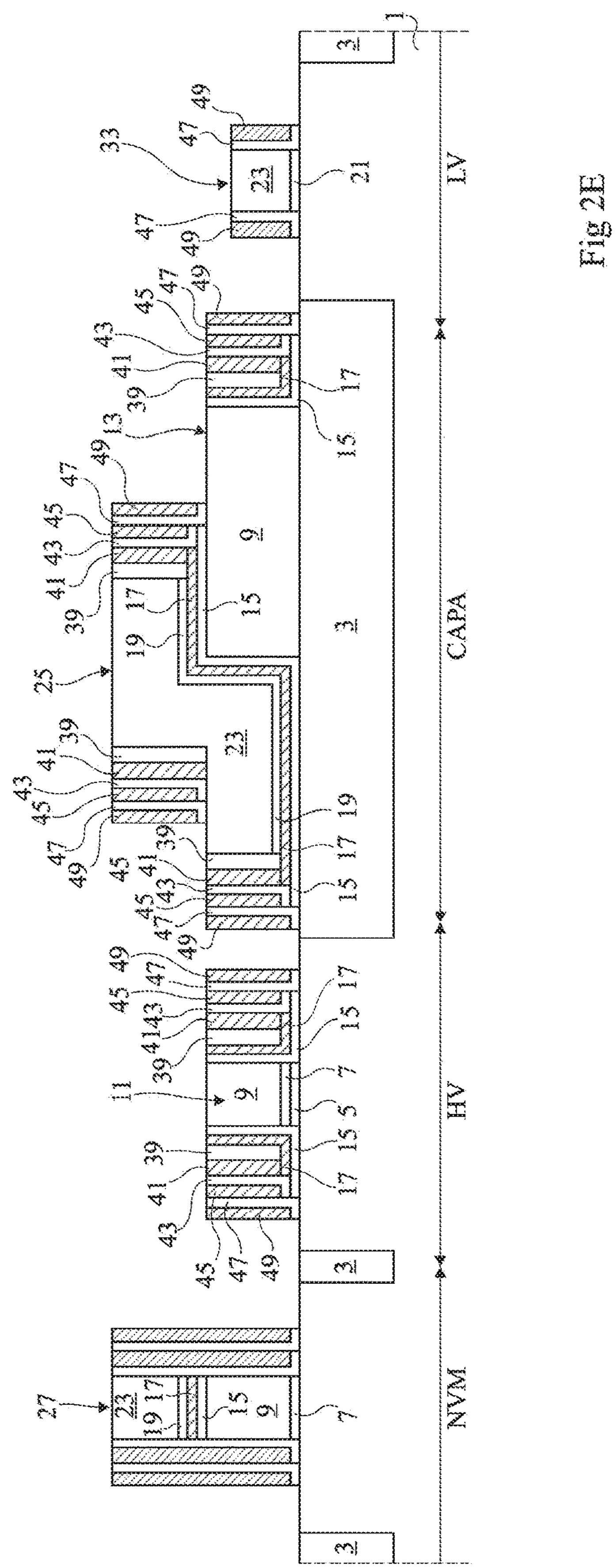

To simplify the drawings, spacers 39 which form against the vertical walls of silicon regions 23 of components NVM and LV are not shown since, as will be seen hereafter, they are removed at a subsequent step (FIGS. 2D and 2E).

FIG. 2C shows the structure of FIG. 2B after the forming of silicon nitride spacers 41. To achieve this, a silicon nitride layer 41 is conformally deposited, at least at the locations of capacitor CAPA and of the NVM and HV transistors. Silicon nitride 41 is then etched by anisotropic etching to form silicon nitride spacers 41 laterally bordering silicon oxide spacers 39 of the HV and NVM MOS transistors and of electrodes 13 and 25 of capacitor CAPA. During the etching of silicon nitride 41, portions of silicon nitride layer 17 are exposed and are also removed. As an example, the thickness of spacers 41 is in the range from 10 to 100 nm, for example, 50 nm.

To simplify the drawings, spacers 41 which form against the vertical walls of components NVM and LV are not shown since, as will be seen hereafter, they are removed at a subsequent step (FIGS. 2D and 2E).

Due to the fact that the etching of silicon nitride 41 and 17 is an anisotropic etching and, further, that spacers 39 are formed before this etching, silicon nitride layer 17 is not overetched under the sides of electrode 25. On the contrary, nitride layer 17 extends on either side of electrode 25, at least under spacers 39 and possibly under spacers 41, layer 15 also extending under spacers 39 and possibly under spacers 41. The electric insulation between electrodes 13 and 25 of capacitor CAPA is then satisfactorily ensured by the succession of oxide layer 15, of nitride layer 17, and of oxide layer 19 and, conversely to the method described in relation with FIGS. 1A to 1G, it is not necessary to provide a thermal oxidation step.

FIG. 2D shows the structure of FIG. 2C after delimitation of gate stack 27 of the NVM transistor, followed by the forming of silicon oxide spacers 43 and of silicon nitride spacers 45. Gate stack 27 is formed in the same way as described in relation with FIG. 1E. After delimitation of gate stack 27, a silicon oxide layer 43 and a silicon nitride layer 45 are successively and conformally deposited at least at the locations of capacitor CAPA and of the NVM and HV transistors. Silicon nitride 45 and silicon oxide 43 are then etched by anisotropic etching to form silicon oxide spacers 43 laterally bordering gate stacks 11 and 27 of the HV and NVM transistors, and electrodes 13 and 25 of capacitor CAPA, and to form silicon nitride spacers 45 laterally bordering spacers 43. As an example, the thickness of spacers 43 is in the range from 4 to 18 nm, for example 12 nm. The thickness of spacers 45 may be in the range from 3 to 10 nm, for example, 5 nm.

To simplify the drawings, spacers 43, 45 which form against the vertical walls of the LV components, are not shown since, as will be seen hereafter, they are removed at the next step (FIG. 2E).

FIG. 2E shows the structure of FIG. 2D after delimitation of gate stack 33 of the LV transistor followed by the forming of silicon oxide spacers 47 and of silicon nitride spacers 49. Gate stack 33 is formed in the same way as described in relation with FIG. 1G. After delimitation of gate stack 33, a silicon oxide layer 47 and a silicon nitride 49 are successively and conformally formed over the entire structure. Silicon nitride 49 and silicon oxide 47 are then etched by anisotropic etching to form silicon oxide spacers 47 and silicon nitride spacers 49. More particularly, spacers 47 laterally border gate stacks 11, 27, and 33 of the HV, NVM, and LV transistors, and electrodes 13 and 25 of capacitor CAPA, and are themselves bordered with silicon nitride 49. As an example, the thickness of spacers 47 is in the range from 1 to 8 nm, for example, 5 nm. The thickness of spacers 49 may be in the range from 10 to 40 nm, for example, 25 nm.

An integrated circuit comprising a capacitor CAPA and transistors of different types, that is, NVM, HV, and LV transistors, are thus obtained. In this circuit, spacers 47 and 49 bordering gate stacks 33 of the LV transistors also border gate stacks 11 and 27 of the HV and NVM transistors and electrodes 13 and 25 of capacitor CAPA, spacers 43 and 45 bordering gate stacks 27 of the NVM transistors also border gate stacks 11 of the HV transistors and electrodes 13 and 25 of capacitor CAPA, and spacers 39 and 41 only border gate stacks 11 of the HV transistors and electrodes 13 and 25 of capacitor CAPA. Thus, the set of spacers bordering the gate stacks of the NVM transistors is at least as thick as that bordering the gate stacks of the HV transistors, which enables to form thinner NVM transistors, and thus denser NVM memory areas. Further, the set of spacers bordering the gate stacks of the LV transistors is itself thinner than that bordering the gate stacks of the NVM transistors, since these transistors are not intended to be submitted to high voltages, which provides logic areas (LV) of optimal density.

As already emphasized in relation with FIG. 2C and conversely to the method described in relation with FIGS. 1A to 1G, the method described in relation with FIGS. 2A to 2E enables to avoid using a thermal oxidation step to electrically insulate electrodes 13 and 25 from each other, the electric insulation between these electrodes being satisfactorily achieved by the stack of layers 15, 17, and 19.

As an example, the NVM transistors are intended to operate at voltages in the range from 2 to 5 V. The HV transistors are for example intended to operate at voltages in the range from 6 to 12 V. The LV transistors are for example intended to operate at voltages in the range from 1 to 4 V. Capacitor CAPA is intended to provide, between its two electrodes 13 and 25, a voltage difference in the range from 4 to 8 V.

Specific embodiments have been described. Various alterations, modifications, and improvements will occur to those skilled in the art. In particular, although the steps of doping to form the drain, source, and channel regions of the NVM, HV, and LV MOS transistors have not been described, it will be within the abilities of those skilled in the art to integrate these steps in the previously-described embodiment.

Above-described capacitor CAPA comprises two electrodes 25 and 13 resting on an insulating structure 3. These electrodes may also rest on a doped layer of a first conductivity type formed in a region of semiconductor layer 1 doped with the second conductivity type. In this case, electrode 25 of capacitor CAPA and the doped region of the second conductivity type may be electrically connected.

Although in the drawings illustrating the previously-described manufacturing method, a single transistor of each of types HV, NVM, and LV and a single capacitor have been shown, it should be understood that a plurality of transistors of each type and/or a plurality of capacitors CAPA may be simultaneously formed on implementation of this method.

The materials and thicknesses previously indicated as an example may be adapted by those skilled in the art. For example, although silicon oxide gate insulator layers 5, 7, and 21 have been described, each of these layers may be made of another insulating material currently used to form gate insulators, for example, of a so-called "high k" material having a higher dielectric constant that silicon oxide. The semiconductor layer may be made of another semiconductor material than silicon, for example, of silicon-germanium. Further, the semiconductor layer may correspond to a semiconductor layer of an SOI-type structure ("Semiconductor On Insulator"), that is, a semiconductor layer resting on an insulating layer, itself resting on a substrate.

The order and the number of the steps of the above-described method may be modified. For example, to form the gate insulators of the HV and NVM transistors, it may be provided to only form layer 5 at the locations of the NVM transistors, and then layer 7 at the locations of the HV transistors by using adapted masking layers.

It will be within the abilities of those skilled in the art to adapt the steps following the steps of FIGS. 2A and 2B while keeping the advantages of the above-described method, that is, the insulation between electrodes 13 and 25 of the capacitor is performed by layers 15, 17, and 19, and the spacers of the transistors formed after the steps of FIGS. 2A and 2B border the gate stack of the HV transistor and electrodes 13 and 25 of capacitor CAPA. Thus, in addition to the HV transistor and to capacitor CAPA, it will be within the abilities of those skilled in the art to form transistors other than NVM and/or LV transistors. Those skilled in the art may also provide manufacturing an integrated circuit only comprising HV transistors and a capacitor CAPA.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method, comprising the steps of:

depositing a first polysilicon layer;

etching the first polysilicon layer to form a first capacitor electrode and a transistor gate;

depositing, in order, a first silicon oxide layer, a silicon nitride layer, and a second silicon oxide layer on both the first capacitor electrode and transistor gate;

depositing a second polysilicon layer;

etching the second polysilicon layer to form a second capacitor electrode separated from the first capacitor electrode by the first silicon oxide layer, the silicon nitride layer, and the second silicon oxide layer;

etching a portion of the second silicon oxide layer that is not covered by the second capacitor electrode to leave first portions of the first silicon oxide layer and the silicon nitride layer extending beyond side edges of the second capacitor electrode;

forming first sidewall spacers on the side edges of the second capacitor electrode, adjacent a side edge of the first capacitor electrode and adjacent side edges of the transistor gate, wherein said first sidewall spacers rest on the first portions of the silicon nitride layer;

etching a portion of the silicon nitride layer that is not covered by the first sidewall spacers to leave second portions of the first silicon oxide layer; and forming second sidewall spacers adjacent said side edge of the first capacitor electrode and adjacent side edges of the second capacitor electrode and the transistor gate, wherein said second sidewall spacers rest on the second portions of the first silicon oxide layer.

2. The method of claim 1, wherein the first sidewall spacers comprise a multilayer of a silicon oxide layer and a silicon nitride layer.

3. The method of claim 1, wherein the second sidewall spacers comprise a multilayer of a silicon oxide layer and a silicon nitride layer.

4. The method of claim 1, further comprising:

etching a portion of the first silicon oxide layer that is not covered by the second sidewall spacers to expose a substrate layer; and forming third sidewall spacers adjacent said side edge of the first capacitor electrode and adjacent side edges of the second capacitor electrode and the transistor gate, wherein said third sidewall spacers rest on the substrate layer.

5. The method of claim 4, wherein the third sidewall spacers comprise a multilayer of a silicon oxide layer and a silicon nitride layer.

6. A method, comprising the steps of:

forming a first capacitor electrode and a transistor gate;

depositing, in order, a first silicon oxide layer, a silicon nitride layer, and a second silicon oxide layer on both the first capacitor electrode and transistor gate;

forming a second capacitor electrode separated from the first capacitor electrode by the first silicon oxide layer, the silicon nitride layer, and the second silicon oxide layer;

removing a portion of the second silicon oxide layer that is not covered by the second polysilicon capacitor electrode to leave first portions of the first silicon oxide layer and the silicon nitride layer extending beyond side edges of the second capacitor electrode;

forming first sidewall spacers on the side edges of the second capacitor electrode, adjacent a side edge of the first capacitor electrode and adjacent side edges of the transistor gate, wherein said first sidewall spacers rest on the first portions of the silicon nitride layer;

removing a portion of the silicon nitride layer that is not covered by the first sidewall spacers to leave second portions of the first silicon oxide layer; and forming second sidewall spacers adjacent said side edge of the first capacitor electrode and adjacent side edges of the second capacitor electrode and the transistor gate, wherein said second sidewall spacers rest on the second portions of the first silicon oxide layer.

7. The method of claim 6, wherein the first sidewall spacers comprise a multilayer of a silicon oxide layer and a silicon nitride layer.

8. The method of claim 6, wherein the second sidewall spacers comprise a multilayer of a silicon oxide layer and a silicon nitride layer.

9. The method of claim 6, further comprising:

removing a portion of the first silicon oxide layer that is not covered by the second sidewall spacers to expose a substrate layer; and forming third sidewall spacers adjacent said side edge of the first capacitor electrode and adjacent side edges of the second capacitor electrode and the transistor gate, wherein said third sidewall spacers rest on the substrate layer.

10. The method of claim 9, wherein the third sidewall spacers comprise a multilayer of a silicon oxide layer and a silicon nitride layer.

* * * * *